(12) United States Patent
Wang et al.

(10) Patent No.: US 6,455,870 B1
(45) Date of Patent: Sep. 24, 2002

(54) UNIPOLAR LIGHT EMITTING DEVICES BASED ON III-NITRIDE SEMICONDUCTOR SUPERLATTICES

(75) Inventors: Wang Nang Wang, Bath (GB); Yurii Georgievich Shreter; Yurii Toomasovich Rebane, both of St. Petersburg (RU)

(73) Assignee: Arima Optoelectronics Corporation, Taipei (TW)

( * ) Notice: Subject to any disclaimer, the term of this patent is extended or adjusted under 35 U.S.C. 154(b) by 0 days.

(21) Appl. No.: 09/595,566

(22) Filed: Jun. 14, 2000

(30) Foreign Application Priority Data

Jun. 15, 1999 (GB) ............................... 9913950

(51) Int. Cl.⁷ .............................................. H01L 29/06
(52) U.S. Cl. .................... 257/12; 372/45; 372/46; 257/190; 257/103
(58) Field of Search ............... 372/45, 46; 257/190, 257/103, 14; 438/40

(56) References Cited

U.S. PATENT DOCUMENTS

| 4,163,238 A | | 7/1979 | Esaki et al. ................... 357/17 |
| 4,620,206 A | | 10/1986 | Ohta et al. .................... 357/4 |
| 5,457,709 A | * | 10/1995 | Capasso et al. .............. 372/45 |
| 5,570,386 A | * | 10/1996 | Capasso et al. .............. 372/46 |
| 5,656,832 A | * | 8/1997 | Ohba et al. ................... 257/190 |
| 5,679,965 A | * | 10/1997 | Schetzina ..................... 257/103 |
| 5,834,331 A | * | 11/1998 | Razeghi ........................ 438/40 |
| 5,923,690 A | * | 7/1999 | Kume et al. ................... 372/46 |
| 6,072,189 A | * | 6/2000 | Duggan ......................... 257/14 |

FOREIGN PATENT DOCUMENTS

| EP | 0 731 510 | 9/1996 |
| JP | 100-22525 | 1/1998 |
| JP | 110-97739 | 4/1999 |

OTHER PUBLICATIONS

Search Report dated Aug. 31, 2000 relating to UK Application No. GB 0014293.5, a corresponding UK application which also claims priority from UK application No. GB 9913950.3, 2 pp.

Search Report relating to corresponding United Kingdom application No. GB 9913950.3 dated Nov. 1, 1999, 1 p.

* cited by examiner

*Primary Examiner*—David Nelms
*Assistant Examiner*—Mai-Huong Tran
(74) *Attorney, Agent, or Firm*—Christie, Parker & Hale, LLP

(57) ABSTRACT

The fabrication of unipolar light emitting devices (ULEDs) based on III-nitride semiconductors is disclosed using an effective "p-n junction" between two n-type III-nitride semiconductor superlattices. Such a device works like a usual light emitting diode at forward bias but the radiation arises not due to recombination of electrons and holes but due to electron transitions from a shallow sub-band superlattice into a deep sub-band superlattice.

7 Claims, 4 Drawing Sheets

UNIPOLAR LIGHT EMITTING DEVICES BASED ON III-NITRIDE SEMICONDUCTOR SUPERLATTICES

BACKGROUND OF THE INVENTION

1. Field of the Invention

The present invention relates to light emitting devices. More particularly, the invention relates to unipolar light emitting devices based on III-nitride semiconductors.

2. Description of the Prior Art

Recent developments in the field of III-nitride semiconductors give rise to a new generation of light emitting diodes and lasers for the visible spectral range. The main advantage of nitride semiconductors in comparison with other wide-band-gap semiconductors is their low degradation in optical devices. However, there is a problem in getting a good p-type conductivity for these materials, which blocks further development of high power lasers and light emitting diodes for the visible spectral range.

SUMMARY OF THE INVENTION

Various aspects of the present invention are set out below.

A light emitting device with a plurality of superlattices which are made exclusively of intrinsic or n-type III-nitride semiconductors or alloys.

A light emitting device with a plurality of superlattices which are made exclusively of intrinsic or n-type III-nitride semiconductors or alloys with active layers between the superlattices made of optically active impurities, impurity complexes or quantum dots.

A white light emitting device with at least three pairs of superlattics which are made exclusively of intrinsic or n-type III-nitride semiconductors or alloys with or without active layers between the superlattices made of optically active impurities, impurity complexes or quantum dots.

A white light emitting device with at least four graded superlattices which are made exclusively of intrinsic or n-type III-nitride semiconductors or alloys with or without active layers between the superlattices made of optically active impurities, impurity complexes or quantum dots.

A light emitting device with a plurality of superlattices which are made exclusively of intrinsic or n-type III-nitride semiconductors or alloys with active layers between the superlattices made of III–V or II–VI semiconductors with different conduction band discontinuities.

A unipolar light emitting device structure based on III-nitride semiconductor superlattices.

A Unipolar light emitting device generating light with a spectrum inside the spectral region from 400 nm to 4000 nm comprising:
  a sapphire substrate;
  a buffer layer;
  a first n-cladding and contact layer made of n-type doped GaN, AlN, InN or their alloys;
  a plurality of undoped or n-type doped superlattices with two or more 3–30 Å thick barriers made of GaN, AlN, InN or their alloys and two or more 3-30 Å thick wells made of GaN, AlN, IN or their alloys;
  a second n-cladding and contact layer made of n-type doped GaN, AlN, InN or their alloys;
  a transparent metallic alloy contact deposited on said second n-cladding and contact layer; and
  a metallic contact to said first n-cladding and contact layer.

A unipolar light emitting device structure based on III-nitride semiconductor superlattices generating light with a spectrum inside the spectral region from 400 nm to 4000 nm comprising:
  a sapphire substrate;
  a buffer layer;
  a first n-cladding and contact layer made of n-type doped GaN, AlN, InN or their alloys;
  a plurality undoped or n-type doped superlattices with two or more 3–30 Å thick carriers made of GaN, AlN, InN or their alloys and a plurality of 3–30 Å thick wells made of GaN, AlN, InN or their alloys;
  an active layer doped or $\delta$-doped with rare earth metals, transition metals and their complexes with shallow donors or other impurities;
  a second n-cladding and contact layer made of n-type doped GaN, AlN, InN or their alloys;
  a transparent metallic alloy contact deposited on said second n-cladding and contact layer; and
  a metallic contact to said first n-cladding and contact layer.

A unipolar white light emitting device structure based on III-nitride semiconductor superlattices comprising:
  a sapphire substrate;
  a buffer layer,
  a first n-cladding and contact layer made of n-type doped GaN, AlN, InN or their alloys;
  at least four undoped or n-type doped graded superlattices with a plurality of 3–30 Å thick barriers made of GaN, AlN, InN or their alloys and a plurality of 3–30 Å thick wells made of GaN, AlN, InN or their alloys;
  at least three active layers for red, green and blue light generation made of semiconductors doped or $\delta$-doped with rare earth metals, transition metals or their complexes with shallow donors or other impurities;
  a second n-cladding and contact layer made of n-type doped GaN, AlN, InN or their alloys;
  a transparent metallic alloy contact deposited on said second n-cladding and contact layer, and
  a metallic contact to said first n-cladding and contact layer.

A unipolar white light emitting device according to the preceding paragraph but without some of the active layers.

The principal structure of a unipolar light emitting device (ULED) according to an example of the invention is shown in FIG. 1.

The physical mechanism of the ULED's operation is illustrated in FIGS. 2a,b. In the ULED, the radiation arises not due to recombination of electrons and holes as takes place in usual light emitting diodes, but due to electron transitions from a shallow sub-band superlattice into a deep sub-band superlattice accompanied by electron energy relaxation via emission of photons. The quantum efficiency of ULEDs based on n-type III-nitride superlattices increases with the increase of the light frequency. Our calculations show that the efficiency of such a ULED is limited by the non-radiative energy relaxation processes and is given by the equation:

$$\eta = \left[1 + \frac{\omega_{LO}}{\alpha^2 \varepsilon_\infty \bar{\varepsilon} \omega_{photon}}\right]$$

where $\omega_{LO}$ is the longitudinal phonon frequency, $\alpha=1/137$ and is the fine structure constant, $\bar{\varepsilon}^{-1}=\epsilon_\infty^{-1}-\epsilon_0^{-1}$, $\epsilon_\infty$ and $\epsilon_0$ are the optical and static dielectric constants respectively and $\hbar\omega_{photon}$ is the energy of the emitting photon quanta.

For the visible spectral range a ULED efficiency of more than 10% can be achieved.

DETAILED DESCRIPTION OF THE PREFERRED EMBODIMENTS

Example 1

Figure 1:
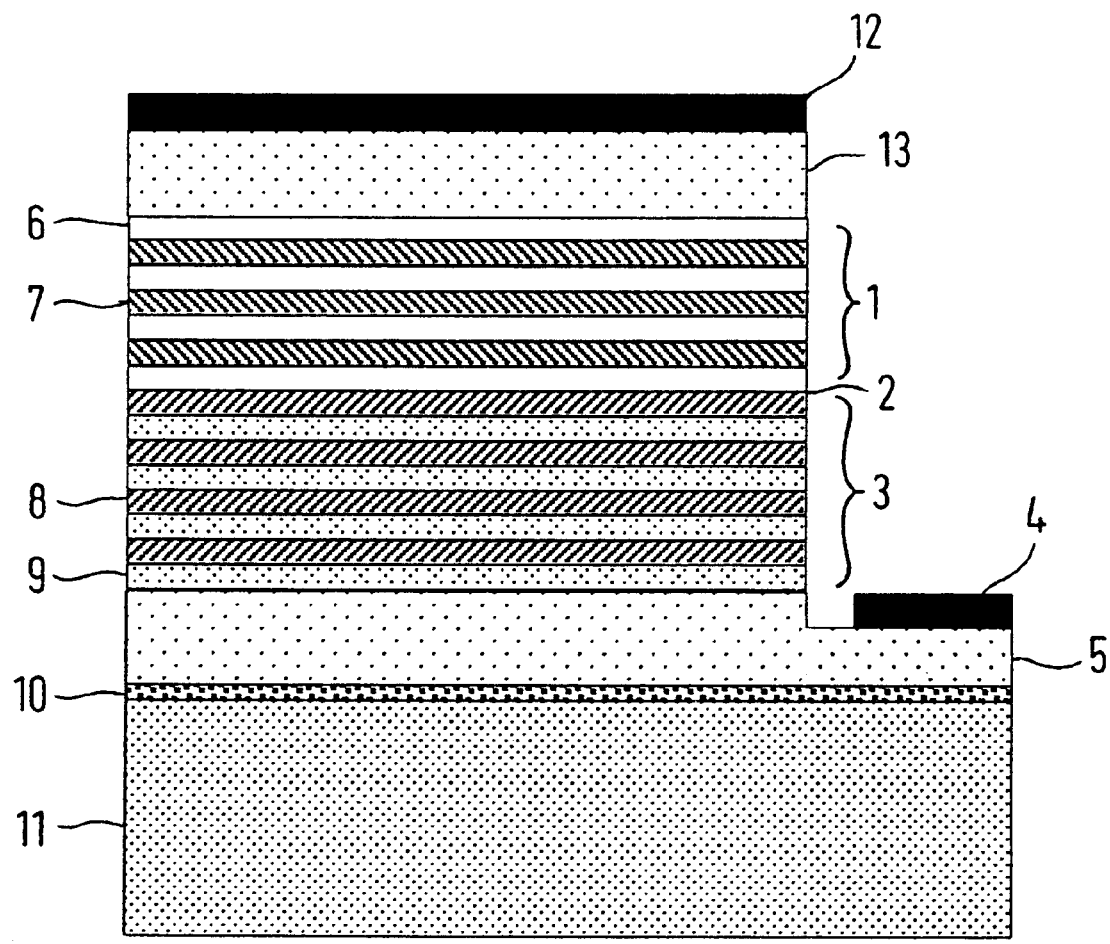
FIG. 1 is a diagram exhibiting the ULED structure of Example 1 which is based on two III-nitride superlattices.

FIG. 1. shows a ULED structure according to Example 1. It has a sapphire ($Al_2O_3$) substrate 11 upon which an aluminium nitride (AlN) buffer layer 10 of 200 Å thickness is formed. Then an n-cladding and contact layer 5 was deposited which is made of 3 $\mu$m thick n-AlN doped by silicon (Si) with a doping level of $10^{18}$–$10^{20}$ cm$^{-3}$. On this layer, a $Ga_{0.05}Al_{0.95}N$/AlN shallow sub-band superlattice 3 was epitaxially grown which is formed of four undoped 20 Å thick $Ga_{0.05}Al_{0.95}N$ quantum wells 8 and four 10 Å thick AlN barriers 9.

Then a GaN/AlN deep sub band superlattice 1 was epitaxially grown, which is formed of three undoped 5 Å thick GaN quantum wells 7 and four 10 Å thick AlN barriers 6. On the top of this superlattice a contact layer 13 made of 1 $\mu$m thick n-$Ga_{0.95}Al_{0.05}N$ with a doping level of $10^{18}$–$10^{20}$ cm$^{-3}$ was deposited. On top of the layer 13, a transparent titanium/aluminium (Ti/Al) metallic contact 12 was deposited. Then another contact 4 was deposited at the corner of the structure on the n-cladding and contact layer 5 after etching.

At a forward bias, when a negative potential is applied to the contact 12 and a positive potential is applied to the contact 4, current flows through the structure, generating red light at the interface 2 between the shallow and deep sub-band superlattices 3 and 1.

Figure 2A:
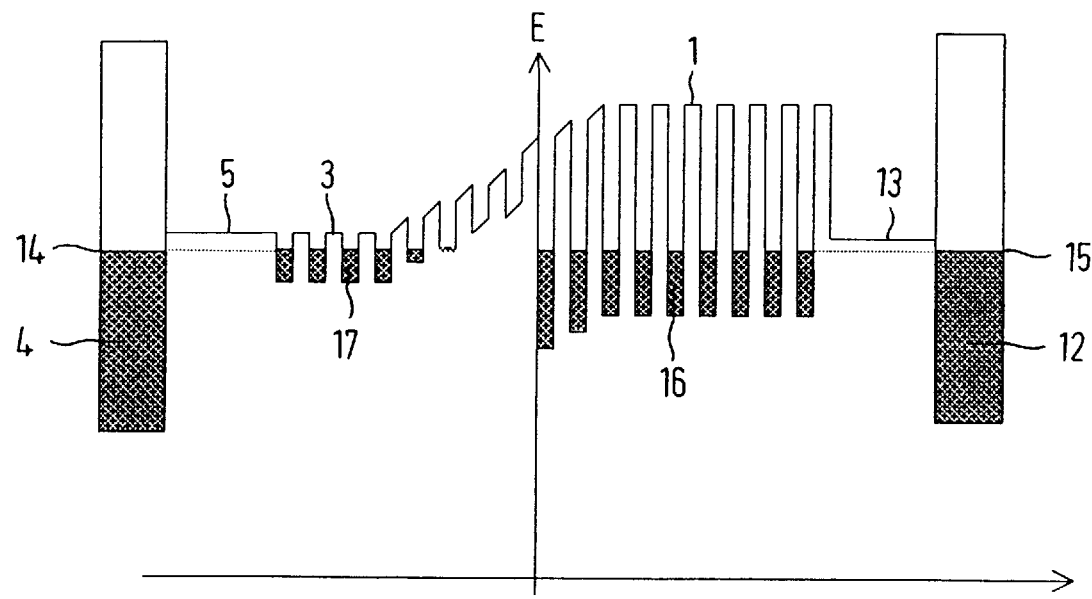
FIG. 2a shows a schematic energy band diagram of energy (E) against co-ordinate position along the structure for an unbiased structure for explanation of the operation of the ULED of FIG. 1.
Figure 2B:
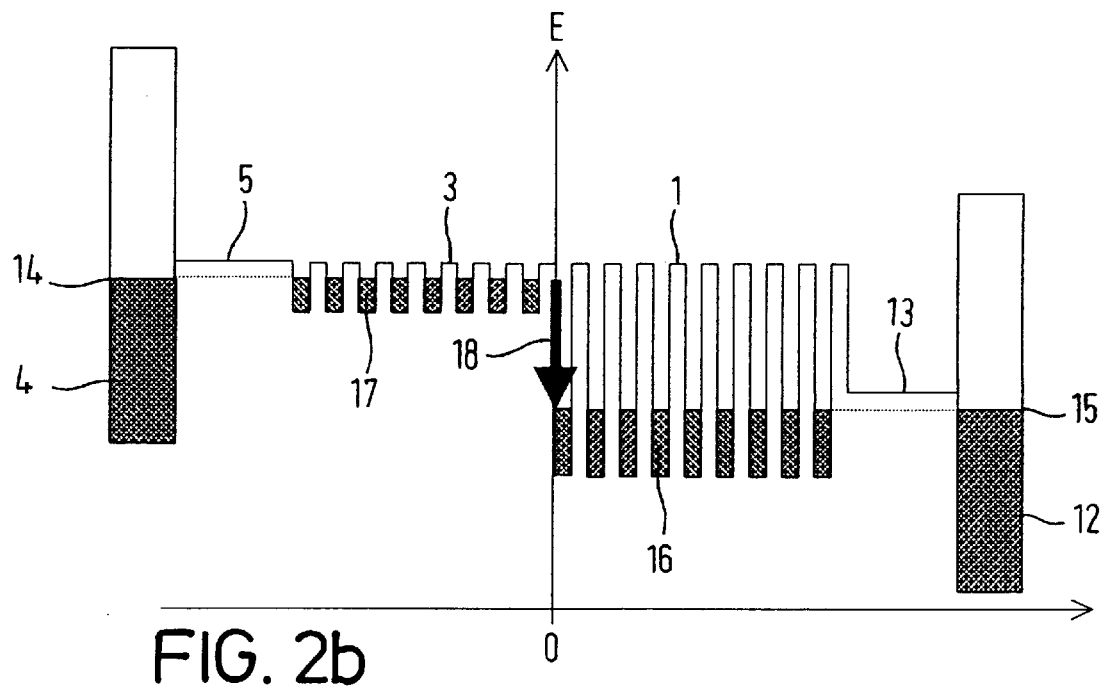
FIG. 2b shows a schematic energy band diagram for a biased structure for explanation of the operation of the ULED of FIG. 1.

FIG. 2a and FIG. 2b (which, for illustrative purposes, show eight wells and eight barriers for superlattice 3 and nine wells and nine barriers for supperlattice 1) show the position dependence of the conduction band edge for an unbiased and a biased ULED structure respectively of Example 1 and illustrate the principle of the ULED's operation.

In the unbiased case, the Fermi level positions 14 and 15 in contacts 4 and 12 are equal. There is a depletion region and band bending on the interface 2 between shallow and deep sub-band superlattices 3 and 1. There is no flow of electrons 16 and 17 through the interface and through the contact and cladding layers 5 and 13.

At a forward bias, when positive potential is applied to the contact 4 and negative potential is applied to the contact 12, current flows through the structure, generating light 18 at the interface 2 between the shallow and deep sub-band superlattices 3 and 1.

Example 2

Figure 3:
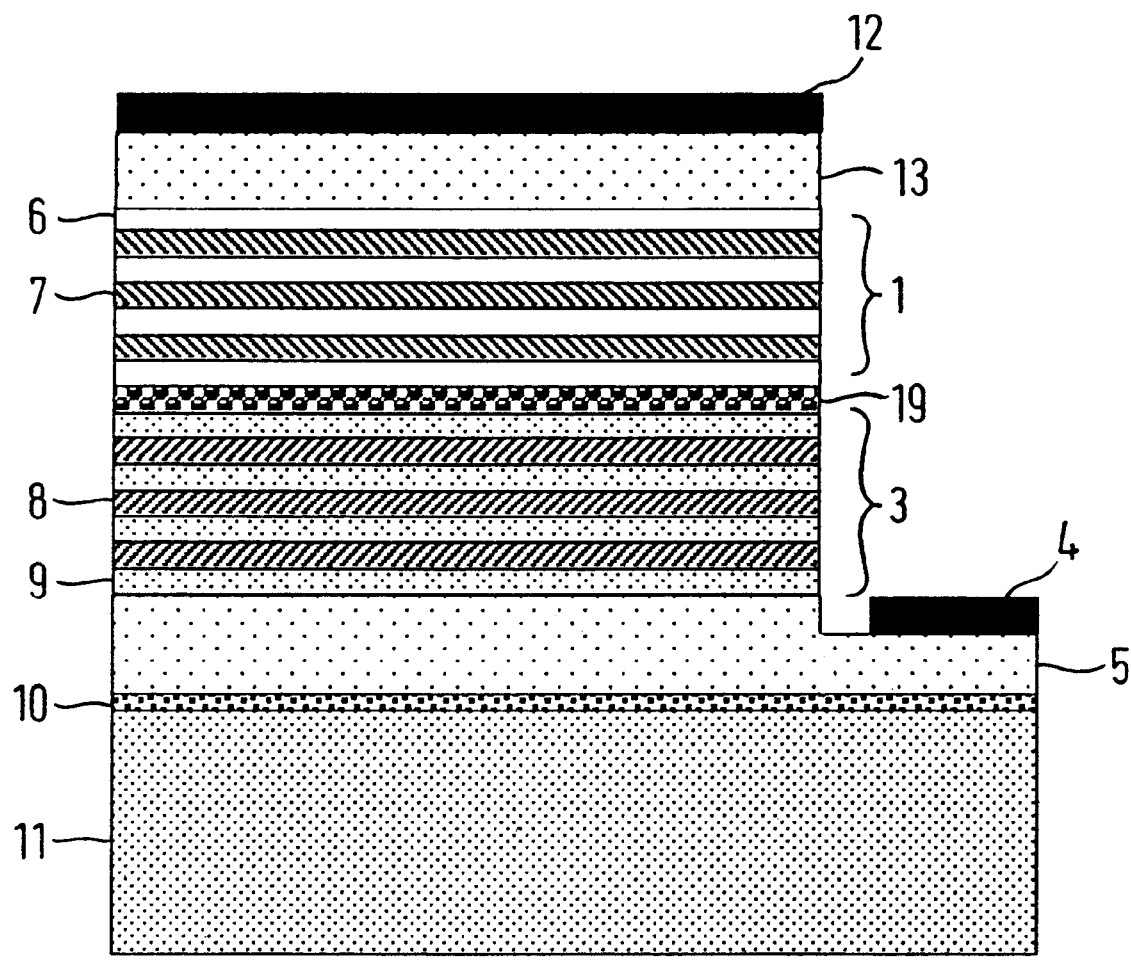
FIG. 3 is a diagram exhibiting the ULED structure of Example 2, which is based on two III-nitride superlattices with an active layer containing optically active impurities or quantum dots.

FIG. 3. shows a ULED structure according to Example 2. It has the same structure as Example 1, shown in FIG. 1, except there is an active layer 19 containing optically active impurities or $Ga_xAl_{1-x}N$ quantum dots at the interface between the superlattices 1 and 3. The active layer allows the use of lateral quantization (LQ) related to quantum dots or impurities to suppress phonon energy relaxation channel for electrons. The use of LQ means the absence of free motion along the quantum well plane. This makes the electron energy spectrum discrete and in the case when all gaps between the levels are higher than optical phonon energy, then one-phonon transitions become forbidden by the energy conservation law.

A second advantage of the active layer is the possibility to tune resonantly the sub-band energy positions in superlattices to optically active transitions of impurities or quantum dots in the active layer. This will allow the excitation of the optical transitions in the active layer by electrical current directly from the superlattice sub-bands.

Example 3

Figure 4:
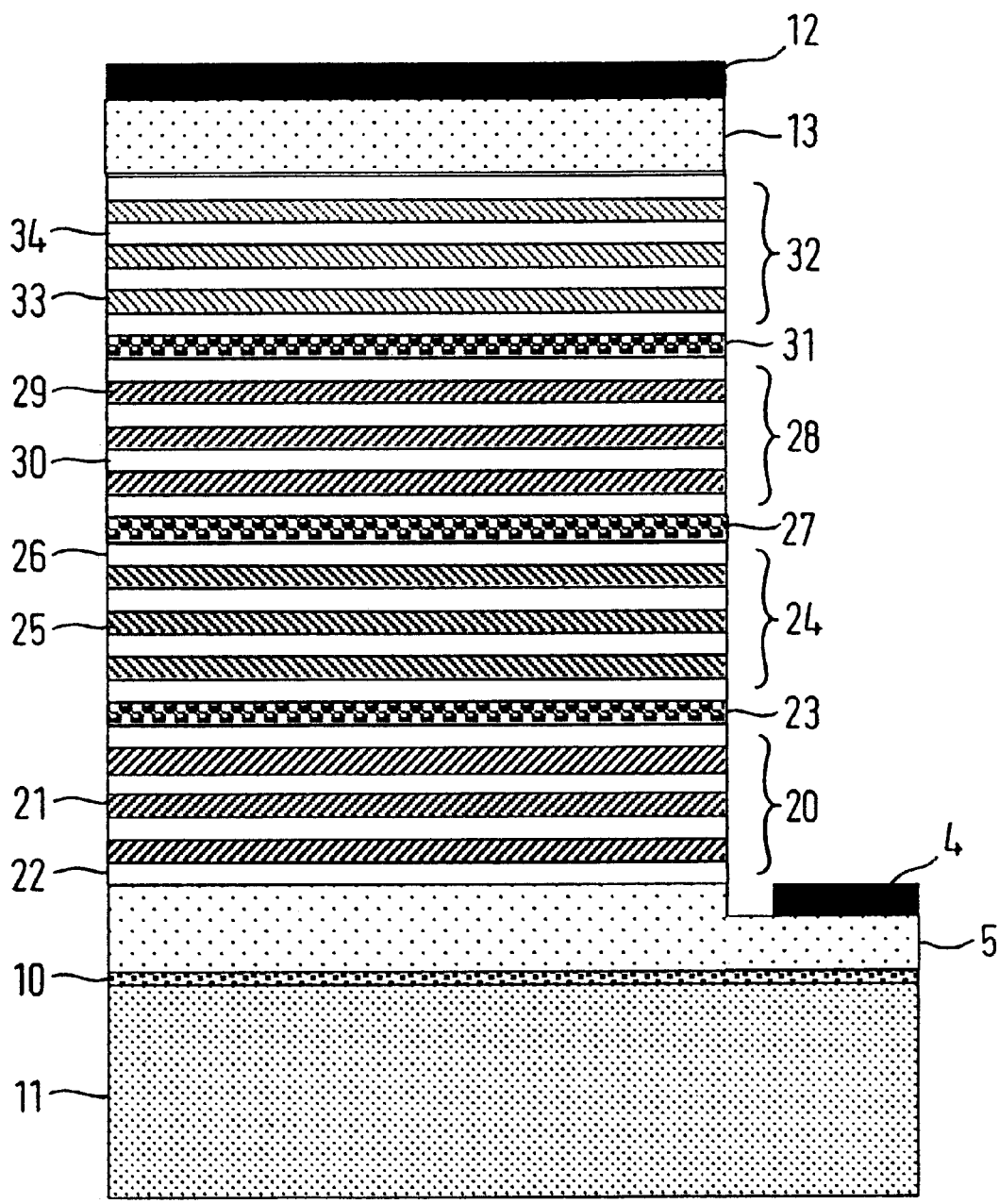
FIG. 4 is a diagram exhibiting the ULED structure of Example 3 with four graded III-nitride superlattices for white light generation.

FIG. 4. shows a ULED structure for white light generation according to Example 3. It has a sapphire ($Al_2O_3$) substrate 11 upon which an aluminium nitride (AlN) buffer layer 10 of 200 Å thickness is formed. Then an n-cladding and contact layer 5 was deposited which is made of 3 $\mu$m thick n-AlN doped by silicon (Si) with a doping level of $10^{18}$–$10^{20}$ cm$^{-3}$. On this layer, a $Gn_xIn_yAl_{1-x-y}N$/AlN graded superlattice 20 was epitaxially grown which is formed of three undoped 5–20 Å thick $Ga_xIn_yAl_{1-x-y}N$/AlN quantum wells 21 and four 10 Å thick AlN barriers 22. The variations of x and y are in the range of 0.05–1.0.

Then an active layer 23 containing optically active impurities or $Ga_xIn_yAl_{1-x-y}N$ quantum dots was deposited.

On the active layer 23 a $Ga_xIn_yAl_{1-x-y}N$/AlN graded superlattice 24 was epitaxially gown which is formed of three undoped 5–20 Å thick $Ga_xIn_yAl_{1-x-y}N$/AlN quantum wells 25 and four 10 Å thick AlN barriers 26. The variations of x and y are in the range of 0.05–1.0.

Then an active layer 27 containing optically active impurities or $Ga_xIn_yAl_{1-x-y}N$ quantum dots was deposited.

On the active layer 27 a $GA_xIn_yAl_{1-x-y}N$/AlN graded superlattice 28 was epitaxially grown which is formed of three undoped 5–20 Å thick $Ga_xIn_yAl_{1-x-y}N$/AlN quantum wells 29 and four 10 Å thick AlN barriers 30. The variations of x and y are in the range of 0.05–1.0.

Then an active layer 31 a containing optically active impurities or $Ga_xIn_yAl_{1-x-y}N$ quantum dots was deposited.

On the active layer 31 a $Ga_xIn_yAl_{1-x-y}N$/AlN graded superlattice 32 is epitaxially grown which is formed of three undoped 5–20 Å thick $Ga_xIn_yAl_{1-x-y}N$/AlN quantum wells 33 and four 10 Å thick AlN barriers 34. The variations of x and y are in the range of 0.05–1.0.

On the top of superlattice 32 a contact layer 13 made of 1 $\mu$m thick n-$Ga_{0.95}Al_{0.05}N$ with a doping level of $10^{18}$–$10^{20}$ cm$^{-3}$ was deposited. On the top of the layer 13 a transparent titanium/aluminium (Ti/Al) metallic contact 12 was deposited. Then another contact 4 was deposited at the corner of the structure on the n-cladding and contact layer 5 after etching

What is claimed is:

1. A unipolar light emitting device with a plurality of superlattices which are made exclusively of intrinsic or n-type III-nitride semiconductors or alloys with active layers between the superlattices made of optically active impurities, impurity complexes or quantum dots.

2. A unipolar white light emitting device with at least three pairs of superlattices which are made exclusively of intrinsic or n-type III-nitride semiconductors or alloys with or without active layers between the superlattices made of optically active impurities, impurity complexes or quantum dots.

3. A unipolar white light emitting device with at least four graded superlattices which are made exclusively of intrinsic or n-type III-nitride semiconductors or alloys with or without active layers between the superlattices made of optically active impurities, impurity complexes or quantum dots.

4. A unipolar light emitting device with first and second superlattices which are made exclusively of intrinsic or n-type III-nitride semiconductors or alloys, with or without an active layer between the superlattices made of III–V or II–VI semiconductors, a conduction band discontinuity in the first superlattice being different from a conduction band discontinuity in the second superlattice.

5. A unipolar light emitting device generating light with a wavelength inside the spectral region from 400 nm to 4000 nm comprising;
   a sapphire substrate;
   a buffer layer;
   a first n-cladding and contact layer made of n-type doped GaN, AlN, InN or their alloys;
   a plurality of undoped or n-type doped superlattices with two or more 3–30 Å thick barriers made of GaN, AlN, InN or their alloys and two or more 3–30 Å thick wells made of GaN, AlN, InN or their alloys;
   a second n-cladding and contact layer made of n-type doped GaN, AlN, InN or their alloys;
   a transparent metallic alloy contact deposited on said second n-cladding and contact layer; and
   a metallic contact to said first n-cladding and contact layer.

6. A unipolar light emitting device structure based on III-nitride semiconductor superlattices generating light with a wavelength inside the spectral region from 400 nm to 4000 nm comprising:
   a sapphire substrate;
   a buffer layer;
   a first n-cladding and contact layer made of n-type doped GaN, AlN, InN or their alloys:
   a plurality undoped or n-type doped superlattices with two or more 3–30 Å thick barriers made of GaN, AlN, InN or their alloys and a plurality of 3–30 Å thick wells made of GaN, AlN, InN or their alloys;
   an active layer doped or d-doped with rare earth metals, transition metals and their complexes with shallow donors or other impurities;
   a second n-cladding and contact layer made of n-type doped GaN, AlN, InN or their alloys;
   a transparent metallic alloy contact deposited on said second n-cladding and contact layer; and
   a metallic contact to said first n-cladding and contact layer.

7. A unipolar white light emitting device structure based on III-nitride semiconductor superlattices comprising:
   a sapphire substrate;
   a buffer layer;
   a first n-cladding and contact layer made of n-type doped GaN, AlN, InN or their alloys;
   at least four undoped or n-type doped graded superlattices with a plurality of 3–30 Å thick barriers made of GaN, AlN, InN or their alloys and a plurality of 3–30 Å thick wells made of GaN, AlN, InN or their alloys;
   at least three active layers for red, green and blue light generation made of semiconductors doped or δ-doped with rare earth metals, transition metals or their complexes with shallow donors or other impurities;
   a second n-cladding and contact layer made of n-type doped GaN, AlN, InN or their alloys;
   a transparent metallic alloy contact deposited on said second n-cladding and contact layer; and
   a metallic contact to said fist n-cladding and contact layer.

* * * * *